United States Patent [19]

Bonori

[11] 4,214,202
[45] Jul. 22, 1980

[54] SLOW SQUARE WAVE MODULATED GYROMAGNETIC RESONANCE SPECTROMETER FOR AUTOMATIC ANALYSIS AND PROCESS CONTROL

[75] Inventor: Maurizio Bonori, Rome, Italy
[73] Assignee: Cafiero Franconi, Rome, Italy; a part interest
[21] Appl. No.: 898,296
[22] Filed: Apr. 20, 1978
[51] Int. Cl.² .............................................. G01R 33/08
[52] U.S. Cl. .................................... 324/313; 324/314
[58] Field of Search .......... 324/0.5 R, 0.5 A, 0.5 AC, 324/0.5 H

[56] References Cited
U.S. PATENT DOCUMENTS

| | | | |
|---|---|---|---|
| 3,568,047 | 3/1971 | Look | 324/0.5 R |
| 3,714,551 | 1/1973 | Pajak et al. | 324/0.5 R |

Primary Examiner—Michael J. Tokar
Attorney, Agent, or Firm—Emrich, Root, O'Keeffe & Lee

[57] ABSTRACT

A method and apparatus for analyzing a sample comprising gyromagnetic species in which the sample, is placed in a uniform DC polarizing magnetic field and irradiated by an AC magnetic field, at an angle to the DC field, while the DC field is modulated by square wave signal whereby the resultant resonance signal comprises a frequency modulated spectrum centered around the resonance frequency and having sideband components separated by the frequency of the square wave signal and the amplitudes of which are proportional to the difference of two resonance intensities switched by the two extreme intensity values of the DC field. Upon detection of the sidebands by an RF receiver, DC levels, proportional to the intensity of the detected sidebands, are provided, permitting display of the resonance line shape on an oscilloscope.

15 Claims, 13 Drawing Figures

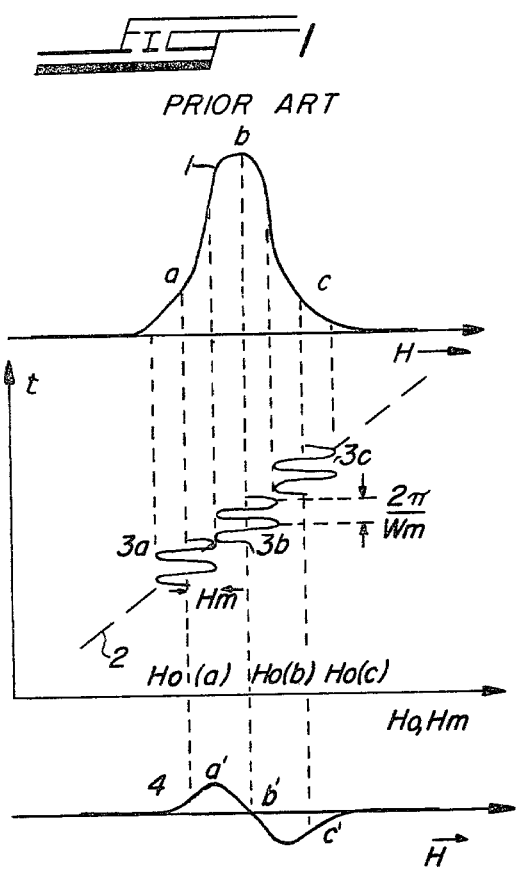
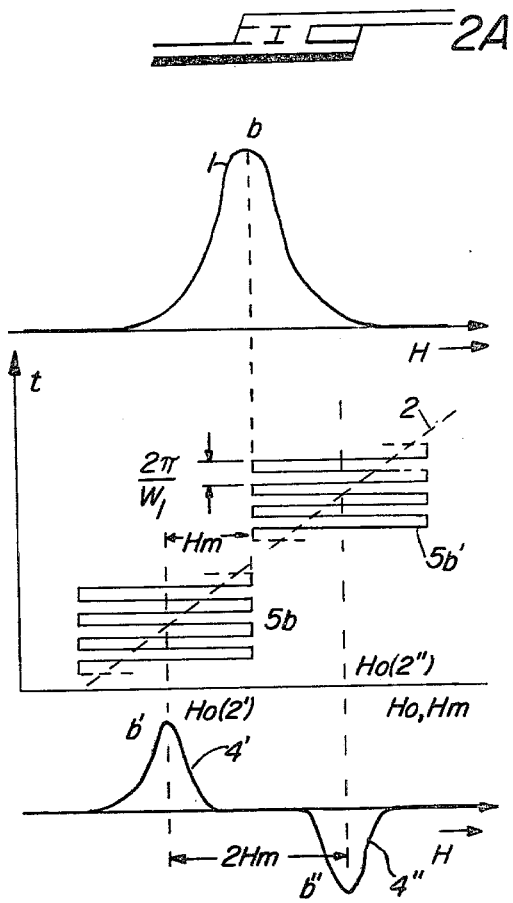
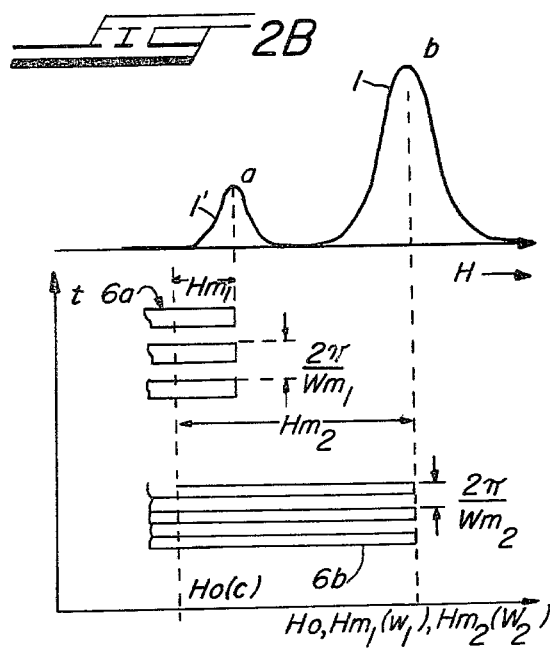
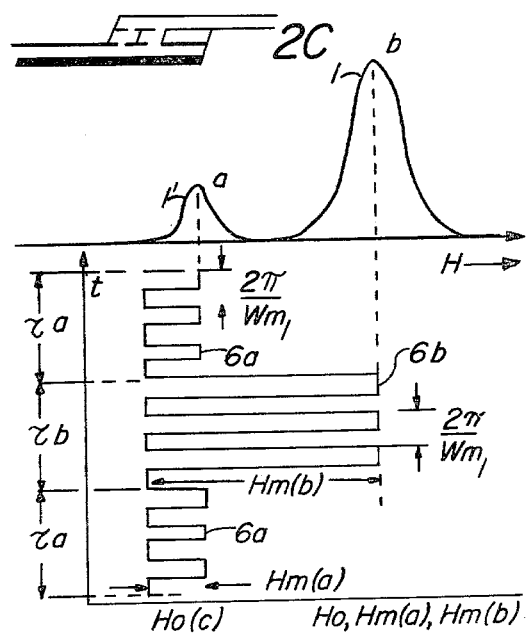

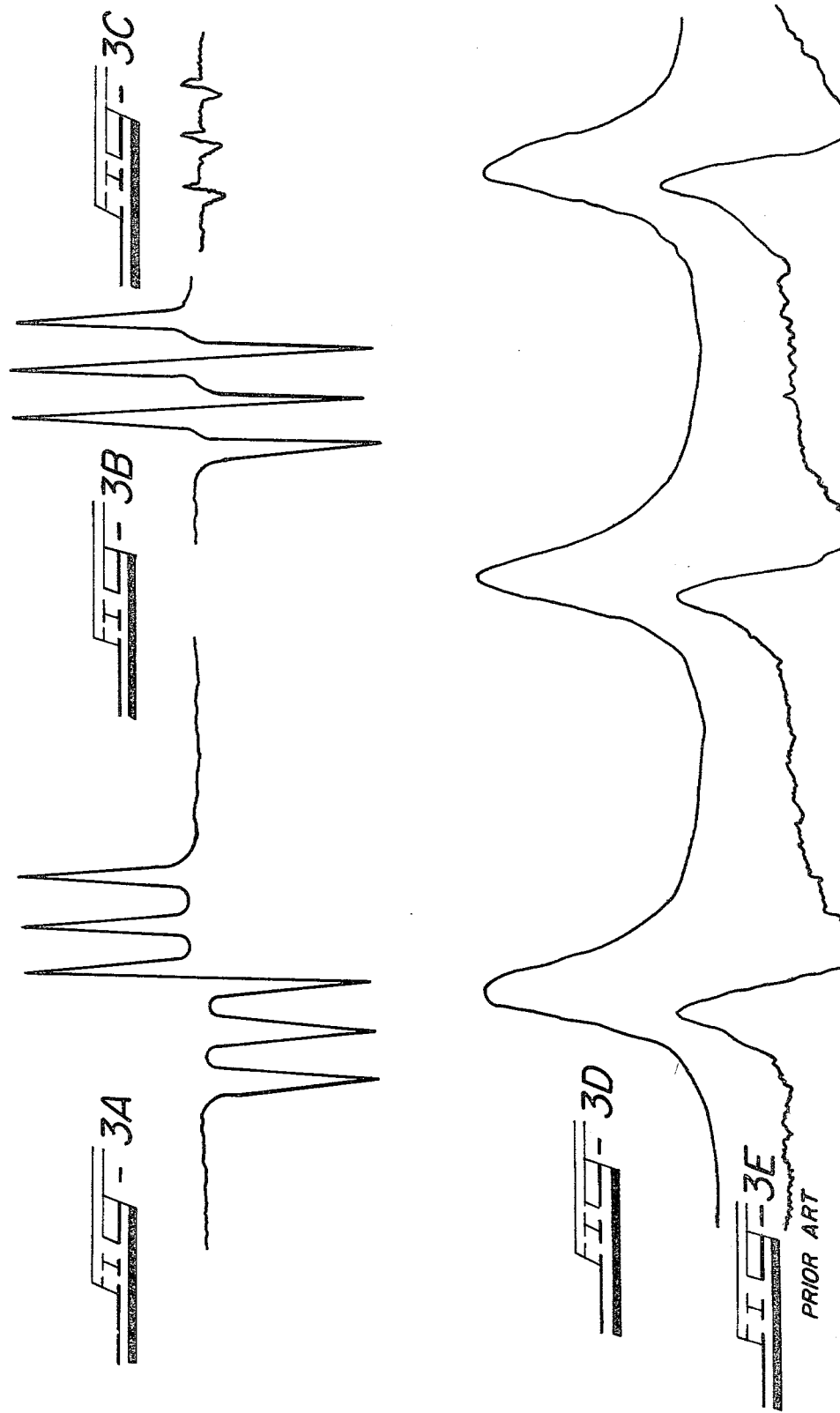

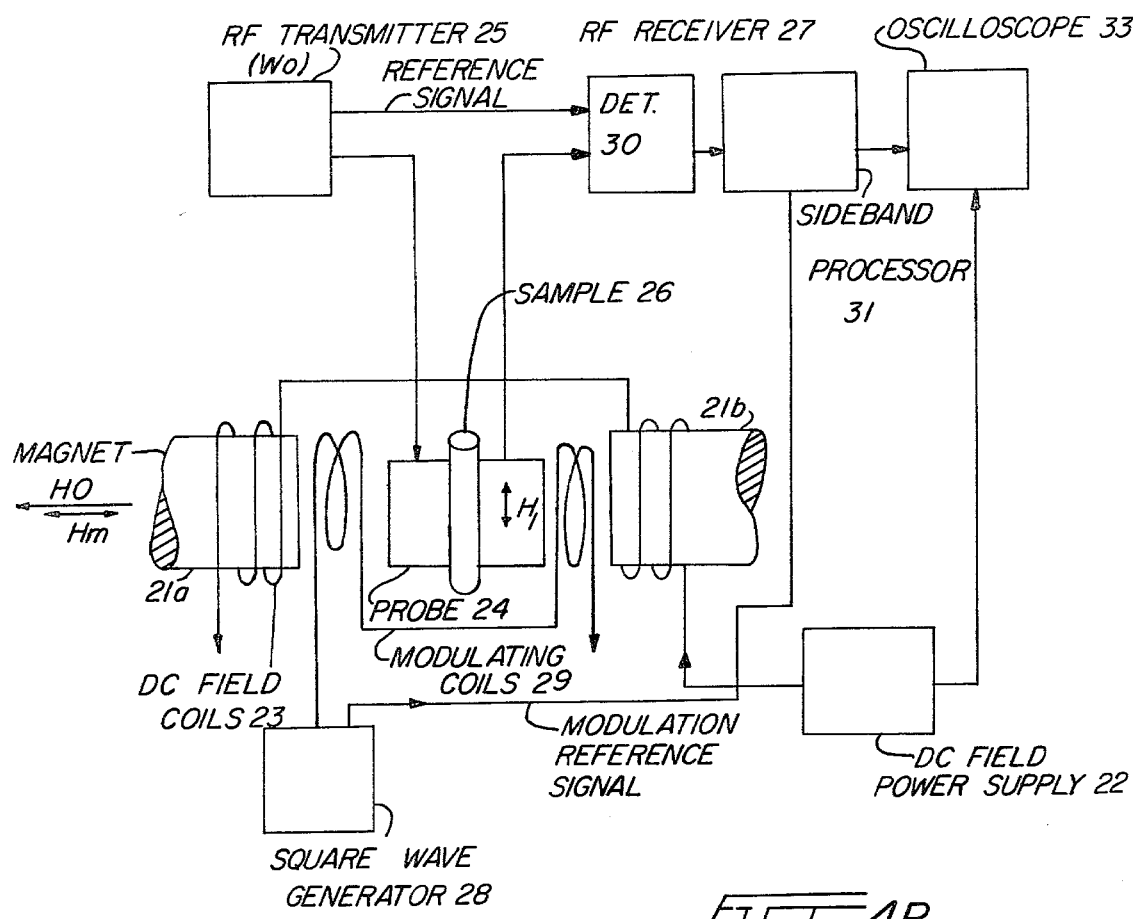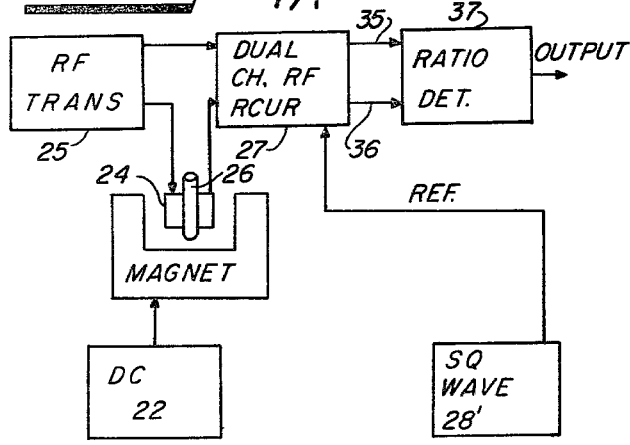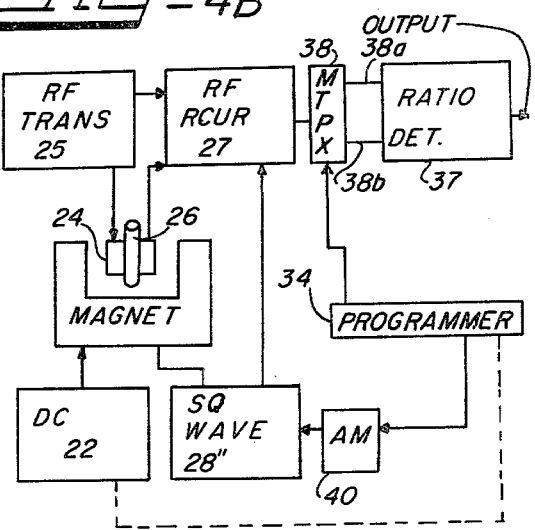

SLOW SQUARE WAVE MODULATED GYROMAGNETIC RESONANCE SPECTROMETER FOR AUTOMATIC ANALYSIS AND PROCESS CONTROL

The present invention relates, generally, to gyromagnetic resonance and, more particularly, to novel and improved gyromagnetic resonance means for analyzing individual gyromagnetic species in substances, compounds and mixtures, that could be used as automated analytical apparatus either for sequential or continuous assays or for controlling, automatically, a chemical process.

In a gyromagnetic resonance experiment, the sample containing the gyromagnetic specie to be analyzed is placed in a probe structure located in a homogeneous DC polarizing magnetic field of intensity $H_o$, hereinafter referred to as "DC field" while being irradiated by an AC magnetic field at an angle with $H_o$. The setting of a DC field on the gyromagnetic bodies cause them to progress around the DC field direction at an angular frequency $\omega_o$ corresponding to the intrinsic Larmor frequency of the gyromagnetic body: $\omega_o = \gamma \cdot H_o$, where $\gamma$ is the gyromagnetic ratio characteristic of the specie being examined. The AC magnetic field, hereinafter referred to as "RF field", is actually produced by some magnetic circuits of the probe structure and when its frequency coincides with the Larmor frequency of the gyromagnetic bodies it is said that the latter are in resonance with such a RF field. Since the detection of the resonance signal is made in presence of the large RF field of the same frequency generated by the spectrometer transmitter, the RF power leaking from the transmitter to the receiver due to a non perfect decoupling between them, would be superimposed on the resonance signal. Therefore the spectrometer output will be subject to baseline instability given by the inevitable fluctuations of the transmitter power and of the degree of decoupling between transmitter and receiver within the probe.

In the prior art spectrometers the effect of the presence of a large RF leakage was minimized by the adoption of modulation shemes whereby a low frequency modulation of the DC field is made with sinusoidal currents which would give rise to a frequency modulation (FM) spectrum of the resonance and therefore in the resonance spectrum there would appear also a number of additional symmetrical sidebands obeying the rules of FM modulation whereby their amplitudes, according to Bessel functions. The practical use of all these FM modulation schemes in gyromagnetic resonance spectrometry is connected with the ability of detecting one sideband of the resonance FM modulated spectrum carrying the resonance information, thus rejecting the unmodulated leakage signal.

In the homodyne detection scheme usually employed in the spectrometers of the prior art, a single conversion of the resonance RM modulated spectrum is provided by mixing them with a reference signal at the transmitter frequency and, subsequently, usually the first of these converted components is selected and processed for extracting the desired information with an optimized signal-to-noise ratio. The selection and processing of detected compounds may for instance in simpler cases by made by either a tuned amplifier followed by an amplitude detector such as a diode etc. working as "asynchronous" detector, or by a wide band amplifier followed by a "synchronous" detector such as a phase sensitive detector using as reference for instance a signal at the same frequency of the field modulation signal to produce a DC output level proportional to the intensity of the first converted component of the spectrum. Also heterodyne detection schemes have been employed for the same purposes and with similar results. Further other signal detecting and processing methods and techniques are known to the people skilled in the arts of magnetic resonance spectroscopy and electronics which may usefully be applied to a resonance RM modulated spectrum for obtaining the desired information suitably detected and processed.

More generally the theory of such a phenonmenon indicates that the actual response of a field modulated resonance also depends upon a number of factors intrinsic of the gyromagnetic resonance phenomenon. In fact it has been shown that when gyromagnetic resonance are excited by variable magnetic fields superimposed on the DC magnetic field, a number of different responses may be obtained, correponding to the actual values of the parameters characterizing both the DC field scan and the modulation, such as the scan velocity of the resonance and the values of the modulation index, frequency, and the shape of the field modulation wave referred to the values of the resonance intrinsic dynamic parameters they are the relaxation times $T_1$ and $T_2$, the reciprocal of the latter representing the resonance linewidth measured in terms of frequency, that is $\gamma \cdot (\delta H)$, if $\delta H$ indicates the resonance linewidth in terms of magnetic field. Therefore, according to the field modulation scheme selected characterized by a modulation wave of angular frequency $\omega_m$ and of given amplitude H if expressed in terms of magnetic field ($\gamma \cdot \Delta H$ terms of frequency) there will be a given response by a particular set of gyromagnetic bodies excited by a RF power of frequency $\omega_o$ of intensity $H_1$ at given scan velocity ($dH_o/dt$), which may be further detected and processed.

The field modulation schemes employed by the prior art spectrometers all employ sinusoidal modulation wave forms and fall within two categories. The first category is known as "fast modulation schemes" and is characterized by having $\omega_m \gg 1/T_2$, that is with the frequency of modulation higher than the resonance linewidth. In this category a first case exhibited the modulation amplitudes larger than the resonance linewidth that is: $\gamma \cdot \Delta H \gg 1/T_2$ and this case will thereinafter referred to as one of fast, large sinusoidal field modulation. The fast, large, sinusoidal modulation scheme, has been widely applied to high resolution gyromagnetic resonance spectroscopy in the case of resonances having small linewidth. As a result, an infinite number of sidebands would appear, symmetrical with respect to the carrier, from which they would, have a frequency offset equal to: $n \cdot \omega_m$, ($n = \pm 1, \pm 2, \pm 3 \ldots$), each sideband representing the complete resonance spectrum in its "true" lineshape. The intensities of the sidebands would vary according to the Bessel functions typical of the sinusoidal FM modulation. In a very common practical case, the modulation amplitude $\Delta H$ and frequency $\omega_m$ have been selected to make the FM modulation index $\beta = \gamma \cdot \Delta H / \omega_m$ as close as possible to the value 1.8 which ensures that the two first-order sidebands posses the maximum intensity. The detection and processing of one of these components allows for sensitivity optimization. The drawbacks associated with this modulation-detection scheme are that the resonance energy is actually smeared out on the FM modulation spectrum containing still a non vanishing carrier and further that the sideband intensities are decreasing very slowly with frequency, so that the resonance energy detected is only a small fraction of the energy of the resonance distributed over the sample resonance spectrum. An application of such a modulation-detection scheme for gyromagnetic bodies having small $\gamma$ values (nuclear spins), is described for instance by A. W. Anderson (The Rev. Sci. Instr. 33, 1160, 1962). However, the gyromagnetic species having high $\gamma$ values it would not be practical to make $\beta$ reaching the optimal value of 1.8 since $\omega_m$ would be too high. Within this category the case in which the conditions of fast, "weak" modulation that is with the modulation amplitude smaller than the linewidth ($\omega_m >> 1/T_2$; $\gamma \cdot \Delta \cdot H << 1/T_2$) has not found practical applications, since actually a differential spectral shape is obtained for each of the sideband instead of the true resonance shape of the previous case.

The second category will be referred to as "slow" modulation schemes and is the one for which $\omega_m$ is: $\omega_m << 1/T_2$ of which two variants are known. In the slow, weak, modulation scheme, the modulation amplitude is smaller than the resonance linewidth, that is: $\gamma \cdot \Delta H << 1/T_2$, whilst in the slow, large modulation scheme is: $\gamma \cdot \Delta H >> 1/T_2$.

The slow, weak, sinsoidal modulation scheme has been employed for wide line detection of resonances of any large width value. It has been shown by N. Bloembergen (Nuclear Magnetic Relaxation, M. Nijhoff, The Hague, 1948) that in this case one obtains spectral components of the signal due to the modulated resonances which are approximately proportional to the derivatives of the resonance shape at the set point of the DC field, which are weaker the smaller the modulation amplitude with respect to the linewidth, although more precise. This case therefore gives derivatives spectral shapes upon scanning the field and in the prior art resulted the only practical way adopted for large linewidth resonances of species of any gyromagnetic ratio.

However, this modulation-detection scheme—sometimes referred to in short as "derivative scheme" exhibits a number of intrinsic limitations. In fact, quantitative information is generally gathered by the detection of the "absorption" resonance mode (rather that the "dispersion" mode) because its integral—the area under its "true" resonance profile—would result proportional to the total number of gyromagnetic bodies at resonance of the sample. Thus a double integration of the recorded shape is actually necessary; a first to obtain the true shape of the absorption mode and the second one for obtaining the area, a result of scarce overall accuracy. Neither such prior art schemes are feasible for a quantitative measure of the resonance intensity relative to a determined point of a resonance spectrum, given the derivative presentation. Further, because in this scheme the output signal level is roughly proportional to the field modulation amplitude, the latter is usually kept as large as possible. In contrast with this requirement however, the field modulation amplitude should be kept smaller than the resonance width (<1:10) to avoid distortion. Thus a compromise is always made between sensitivity and accuracy in the recording of the resonance with neither one being optimized.

In the slow, large sinusoidal modulation scheme, for which still is: $\omega_m << 1/T_2$, but the modulation amplitude is larger than the resonance linewidth, the intensities of the lineshapes detected are higher than those of the derivative sinusoidal scheme above, other things being equal. Examples of this behaviour of gyromagnets subject to this modulation scheme are given by C. P. Poole (Electron Spin Resonance, Interscience, New York, 1967 p. 407). For this case, the theory predicts however a large distrotion of the true spectral shape detected, which makes this scheme almost useless from a practical point of view.

SUMMARY OF THE INVENTION

In the present invention an original gyromagnetic resonance spectrometer is disclosed, which includes, in addition to the basic means of generating the DC polarizing fields $H_o$, the RF transmitter and receiver at the frequency $\omega_o$, is developed according to methods and techniques well known to the people skilled in the art of gyromagnetic resonance spectroscopy, means for generating on the sample volume a vectorial magnetic field distribution periodically modulated by a square wave of frequency $\omega_m$ which adds vectrorially to the uniform DC field, generating a resultant field characterized volume periodically switched at times ($\pi/\omega_m$) corresponding to the half-period of the square wave frequency $\omega_m$, during which each of the two extreme distributions assumes a stationary value.

By operating in a way well known to the people skilled in the art of magnetism on said means generating said DC and modulating fields, one may generate the two said extreme distributions of resulting magnetic fields which will be sampling two distinct points of the same resonance curve of the sample under examination and therefore a switching action of the relative resonance intensities corresponding to those extreme distribution values will occur. By this novel type of modulation disclosed, the radiofrequency resonance signal obtained is carrying an original and particular resonance information distributed on the various components of the spectrum arising from square wave FM modulation of the resonance at the frequency $\omega_m$. In fact, a theoretical analysis of a square wave modulation of a resonance phenomenon has been carried out for different types of spectroscopy by R. Karplus (Phys. Rev. 73, 1027, 1948), and other Authors have shown that such an analysis may be applied also to gyromagnetic resonance spectroscopy, having however, limited their analysis to the cases of sinusoidal wave magnetic field modulation. These application have given theoretical grounds to the experimental results obtained by the adoption of the prior art modulation schemes described above. If we apply the analysis of R. Karplus to the square wave modulation as disclosed above, we find that, under given conditions, a square wave field modulation of a resonance gives rise to a particular and original FM modulation spectrum centered around the frequency $\omega_o$ the components of which are shifted from $\omega_o$ by multiples of $\omega_m$ and possessing intensities obeying to a law different from that typical of the cases of sinusoidal wave modulation, the main feature of which being that the amplitude of each component is proportional to the difference of the two resonance intensities switched by the two resultant extreme stationary field distributions of the magnetic field on the sample. This result is exploited in the present invention for obtaining quantitative informations on the intensity difference between the switched resonance intensities of the sample.

From the theoretical analysis, it may be shown that the particular conditions under which the disclosed results take place are practically the same that are sufficient for the applicability of both the slow, weak derivative sinusoidal modulation scheme and of the slow, large sinusoidal modulation scheme of the prior art and that are well known to the people skilled in the art of gyromagnetic resonance. The conditions may be summarized as: $(\omega_m << 1/T_2)$ and $(\omega_m << \omega_o)$, and $\omega_m << \gamma \cdot H_1$ where $H_1$ is the intensity of the RF magnetic field. The magnetic field should not be too high so as to prevent saturation of that particular gyromagnetic body constituting the sample and characterized by a value of $\gamma$ and of $T_1$ and $T_2$, that is: $(\gamma^2 \cdot H^2 \cdot T_1 \cdot T_2) << 1$. On the other hand, in this case of a periodical modulation, a quasi-stationary state will be reached which will be as close to the true stationary case as the relaxation times are shorter than the modulation wave period, that is: $\omega_m << 1/\sqrt{T_1 \cdot T_2}$, a further condition to be met and that is more practicable for samples exhibiting short relaxation times that are exhibiting a large linewidth. The above set of conditions, with the square wave magnetic modulation of the gyromagnetic resonance which is a feature of the present invention, are hereinafter referred to as "slow square wave field modulation of the resonance".

A square wave modulation scheme of a gyromagnetic resonance giving rise to effects described by R. Karplus and similar to those obtained by the schemes proposed in the present invention has been described in the prior art (S. L. Gordon & J. D. Baldeschwieler: J. of Chem. Phys., 43, 76, 1965). However, such an effect has been obtained by a square wave modulation of the intensity of the RF field $H_1$ rather than by square wave modulation of the static magnetic field. With respect to the particular modulation scheme of the prior art, the ones which are features of the present invention present so many important differences with respect to the purposes to be attained, to the experimental conditions and to the devices employed that it would be possible to consider them neither similar nor equivalent. In fact, these Authors first of all modulate the RF field with a frequency $\omega_m >> 1/T_2$ (fast modulation) in order to pick up and exploit exclusively the effects which arise in times comparable with the relaxation times of the sample, effects which, on the contrary, are discarded in all the features of the present invention and would apply only to samples exhibiting relatively long relaxation times. Further, the adopted experimental means are totally different in that they are made to modulate the RF field instead of the DC magnetic field. It therefore allows that the same general phenomenology has been exploited in the prior schemes for a different purpose and operating on a different sample by different experimental means.

One particular form of the present invention comprises a spectrometer having means for providing a slow square wave field modulation of the sample, the vectorial field of which is uniform on the sample and directed along the respective vector of the DC field so that the resultant vectorial field is also uniform and square wave modulated, the modulation amplitude $\Delta H$, that is the difference between the stationary intensities of the resulting uniform field resulting being always greater than the resonance linewidth, that is a "large" modulation $(\gamma \cdot \Delta H >> 1/T_2)$. When one of the two extreme intensities of the resulting field is always out of the resonance curve, the other extreme intensity brings to resonance a particular point of the resonance curve so that a slow scanning of only the latter extreme intensity allows one to obtain the "true" waveform of a resonance curve of gyromagnetic bodies exhibiting any $\gamma$ value.

Other forms of the present invention derived from this allows instead the detection of a plurality of values of resonance intensities for a sample immersed in the same uniform DC field. In one of these forms, a plurality of slow, large amplitude modulation magnetic fields of amplitude and frequency different from each other are employed to sample a corresponding number of resonance intensities. In a further form, only one slow, large amplitude modulation field at a single frequency is employed in combination with either a commuting of the DC field intensity to sample a plurality of intensities or a commuting of the modulation amplitude, or both, to sample in succession the same plurality of resonance intensities of the resonance curve.

These disclosed modulation schemes that are forms of the present invention are such that by the use of suitable signal processing means coupled to the radio-frequency receiver it is possible to obtain output signals proportional to the ratio between two detected resonance intensity differences one of them being taken as reference, and therefore to obtain single resonance intensities and complete resonance lineshapes normalized with respect to a given reference resonance intensity and therefore independent from the fluctuations and setting of the spectrometer controls.

Thus, in the method disclosed in the present invention, a precise measure of a resonance intensity is actually obtained without recurring to any integration of the spectral waveform as instead necessary with the prior art spectrometers employing the sinusoidal derivative scheme. This feature of the present invention is generally very useful and in particular is useful for automatic analytical measurements and process control.

A further feature of the present invention is that the reference resonance may also belong to reference gyromagnetic bodies internal to the sample itself to be examined and therefore subject to the same plurality of modulation fields and to the same DC field, thus simplifying probe and magnet design. In this regard, it should be observed that the prior art spectrometers employing the slow, small amplitude sinusoidal scheme, could only detect the resonance intensity of one sample at the time if immersed in the same DC and modulation fields and furthermore through a measure of the derivative at that point of the resonance curve. Therefore, a reference sample had to be located separately from the sample to be examined and had to be independently subjected to a modulation field of the same or different frequency, while being subject to the same or different DC field intensity. Further, with such a prior art spectrometers, it may be difficult to make, a real normalization of the resonance lineshape since a scan of the DC field would shift both resonance intensities separately modulated.

A further advantage of all the forms of the present invention is in the net gain in the detection sensitivity when compared with the derivative sinusoidal scheme of the previous art. In fact in a direct comparison of the two methods, the sensitivity increase would result proportional to the ratio between the absolute intensity of the resonance measured by the disclosed method and the intensity as measured by the sinusoidal derivative scheme yielding an absolute value calculated as the product of the derivative of the slope of the resonance curve at the same point by the modulation amplitude, the latter having as said before, to be kept smaller than the same resonance linewidth.

DESCRIPTION OF THE DRAWINGS

These and other objects and features and advantages of the present invention will become apparent to those skilled in the art of gyromagnetic resonance from the following specification if considered in conjunction with the accompanying drawings, in which like reference numerals refer to like parts, wherein:

FIG. 1 represents various resonance shapes relative to weak, slow sinusoidal modulation scheme used in prior art spectrometers for obtaining derivative lineshapes;

FIG. 2A, FIG. 2B, FIG. 2C, and FIG. 2D represent various modulation schemes that are features of this invention that employ square wave modulation, derived from a slow, square large modulation waves;

FIg. 3A; FIG. 3B; FIG. 3C FIG. 3D and FIG. 3E represent examples of experimental electron paramagnetic resonance spectra of a sample containing a free radical when analysed with both modulation schemes that are features of this invention and prior art schemes, for comparison purposes;

FIG. 4 is a simplified representation of a gyromagnetic resonance spectrometer incorporating the principles of the present invention;

FIG. 4A is a gyromagnetic resonance spectrometer similar to that shown in FIG. 4, but employing a multi channel receiver; and, FIG. 4B is a gyromagnetic resonance spectrometer similar to that shown in FIG. 4, but which employs commutation of the square wave modulation between different intensities.

DETAILED DESCRIPTION

Referring to FIG. 4, there is shown a simplified representation partially in block diagram form, of a gyromagnetic resonance spectrometer for analyzing a sample of matter 26 containing gyromagnetic bodies. It includes a suitable magnet 21 producing a DC polarizing magnetic field, the intensity $H_o$ of which can be swept by DC current from a power supply 22 which drives a coil system 23 wound on pole pieces 21a and 21b of the magnet. The value of the field intensity $H_o$ is set as to bring the gyromagnetic bodies of resonance at a frequency $\omega_o$ and is swept through the resonance curve. The spectrometer probe 24, which is designed according to any method and technique well known to the people skilled in the art of gyromagnetic resonance spectroscopy, is placed within the gap between the pole pieces 21a and 21b. An RF transmitter 25 includes an oscillator for generating a signal at frequency $\omega_o$ which is coupled to the probe and produces within its magnetic structure an RF magnetic field of amplitude $H_1$ at an angle with the direction of the DC field $H_o$. The gyromagnetic bodies of the sample 26, which is placed within the magnetic structure of probe 24, are thus excited by RF field $H_1$ while immersed in the DC field and undergo the resonance phenomenon.

A square wave oscillator 28 generates a signal at a frequency $\omega_m$. The square wave signal, drives coil system 29, modulates the DC field on sample 26 providing a slow, square wave modulated magnetic field of amplitude $H_m$. The resulting resonance signal of sample 26 consists of a modulation spectrum centered about frequency $\omega_o$, the sidebands which are separated by frequency $\omega_m$ and carry the resonance information.

The resonance signal arising within the probe magnetic structure is detected by a homodyne type of receiver 27, including a detector 30, in which a single conversion of the modulation spectrum takes place by mixing it with a reference signal at frequency $\omega_o$ obtained from transmitter 25 to produce converted sidebands of the modulation spectrum. The selection and the processing of the component sideband detected by detector 30 is made by a sideband processor 31, either asynchronously, or synchronously using a reference signal at frequency $\omega_m$ provided by square wave generator 28. The output of the sideband processor 31 is a DC level proportional to the intensity of the selected component sideband of the spectrum, which is applied to an oscilloscope 32 for display. Thus, when the field is swept through the resonance by the signal output of the DC power supply 22, the resonance wave shape appears on the oscilloscope 32.

Referring now to FIG. 1 there are shown the results of an hypothetical recording of a resonance by the slow, weak sinusoidal modulation scheme of the prior art. The resonance lineshape 1 is scanned through by a linear sweep 2 of the DC field $H_o$.

A small amplitude sinusoidal modulation field of period $(2\pi/\omega_m)$ is superimposed the values of the DC field intensity $H_o$ during the scan and is represented by waveforms 3a, 3b, 3c applied at the values $H_o(a)$, $H_o(b)$ and $H_o(c)$, respectively. Such modulation fields generate converted resonance signals that, after proper detection and processing, may give signals the levels of which will be proportional to the slope of the resonance line 1 at the points a, b and c respectively, if the modulation amplitudes of waves 3a, 3b and 3c are kept small enough compared with the linewidth of resonance 1. If one considers the continuous linear sweep 2 of the DC field $H_o$ while maintaining constant the amplitudes of the field modulation waves 3, one may obtain a waveform such as 4 that is approximately the first derivative of the resonance shape 1 detected in the absorption mode.

Referring now to FIG. 2A, there are shown the waveforms illustrating a slow, large modulation scheme which is a feature of this invention, hereinafter referred to as a "slow, large square wave scheme". In describing this scheme and the ones following it, only the differences with respect to the derivative scheme of the prior art will be illustrated. Thus, for a value $H_o(b)$ of the DC field, and AC square wave 5b of amplitude $H_m$, larger than the linewidth of resonance 1 but smaller than $H_o$, of frequency $_m(<<1/T_2)$ and uniform over the sample is superimposed on the DC field by a symmetrical modulator with the representative vector parallel to that of the uniform DC field. The resultant magnetic field is uniform over the sample volume, and its intensity is modulated by the square wave, so that the resultant uniform field is switched between the values $(H_o+H_m)$ and $(H_o-H_m)$ in times $(\pi/\omega_m)$. The switching action of said resultant field is generating the correspondingly modulated resonance signal, the spectrum of which contains harmonic components the intensities of which are proportional to the difference between the intensity in the b point of resonance shape 1, corresponding to the top value $H_o(2')+H_m$ of the resultant field, and the intensity zero of resonance shape 1, corresponding to the bottom value, $H_o(2'')-H_m$, of the resultant field, since it is actually falling off resonance. Therefore, when a slow, continuous linear scan of the DC field such as 2 is made, a doubled resonance shape 4' and 4'' is obtained, of which each waveform is a true replica of waveform 1.

It is to be noted that with increasing DC field values, the top edge of the modulation wave occurs out of resonance 1 while the bottom edge which corresponds to $H_o(2'')-H_m$ of the resultant field, is still within the resonance. By processing the resonance signal obtained during the scan by a phase sensitive detector, one will thus obtain lineshape 4″, which reproduces shape 4′ apart of a sign change due to the phase change of the detected resonance spectrum component.

Therefore, against the first derivative presentation of the resonance of the derivative scheme of the prior art, the slow large square wave scheme, which is a feature of the present invention, produces undistorted output waveforms which are point by point proportional to the true intensities of the resonance shapes, however complex these may be. It is to be noted that in the scheme of FIG. 2A the amplitude of the square wave 5 is not critical, provided it is kept larger that the resonance linewidth so that one extreme intensity of the resultant field fall always off resonance during the scan.

It is also to be noted that in this form of the present invention and in the other forms derived from this, a result similar to that of FIG. 2A could instead be obtained by a square wave modulated undirectional uniform field similarly superimposed on a DC field of amplitude $2 H_m$ instead of bidirectional waves 5 of amplitude $H_m$.

Referring now to FIG. 2B, there are shown the waveforms relative to a slow, large amplitude square wave modulation-detection scheme, which is derived from the preceding one and is still a feature of this invention, that illustrates how the resonance intensity may be normalized with respect to a determined intensity of a reference resonance through proper processing of the detector output level. In FIG. 2B, we have a complex resonance spectrum made up of resonance 1 and of reference resonance 1′. The modulation waveforms 6a and 6b of amplitudes $H_{m1}$ and $H_{m2}$ and angular frequencies $\omega_{m1}$ and $\omega_{m2}$ respectively of FIG. 2B are provided square wave generator 28′ which may compose two signal generators the outputs of which are alternatily periodically coupled to the magnet system modulating coils. These waveforms are now superimposed on the DC field $H_o$ set to the fixed value $H_o(c)$; however the results described below would apply to a slowly DC field swept spectrum as well provided the bottom values of the resultant fields: $(H_o-H_{m1})$ and $(H_o-H_{mw})$ will always fall off resonances 1 and 1′. The modulation scheme is a dual frequency one, associated with a dual channel receiver 27′, shown in FIG. 4A, having one detection channel for each selected resonance spectrum component associated with the respective modulation frequency.

An analysis of the phenomenon shows that at the respective outputs 35 and 36 of the two channels of the receiver 27′ there will appear output levels proportional to the intensities respectively monitored at the points a and b of the respective resonances 1′ and 1.

A normalization of the signal level of the measuring channel $(\omega_{m2})$ with respect to the level of the reference channel $(\omega_{m1})$ is then made by taking the ratio of the respective output DC levels by way of ratio detector 37, or some other suitable signal processing means, well known to the people skilled in the art of electronics. Such a ratio will result independent of the settings and fluctuations of the transmitted RF power level and will remain constant provided the gain of both channels of the receiver does not change independently. These results apply also in the case in which the unknown and the reference resonance belong to difference gyromagnetic species contained in the same sample volume, both species being subject to both modulation fields, a result not obtainable with the prior art derivative scheme.

This large amplitude slow square wave modulation scheme can be extended for a plurality of modulation waves of different frequencies $W_1, W_2 \ldots W_n$ by using detector and processing means characterized by accompanying number "n" of channels each output of which can be normalized with respect to any other output taken as reference. Such a feature of this invention will thereinafter be referred to as "slow, large square wave multichannel scheme".

Referring to FIG. 2C, a modulation-detection scheme is presented also derived from that of FIG. 2A which is also a feature of this invention, but which slow, large square modulation waves of single frequency to obtain the same results obtained with the scheme described in FIG. 2B. Since the modulation frequency of waves 6a and 6b is the same, the receiver 27 (FIG. 4B) is a single channel one $(\omega_{m1})$; however a programmer 39 via amplitude modulator 40 switches periodically the amplitudes $H_m(a)$ and $H_m(b)$ of the modulation square wave provided by the square wave generator 28″, for time intervals $\tau_a$ and $\tau_b$ respectively with a commutation frequency $1/(\tau_a+\tau_b)$ smaller than $(\omega_{m1}/2\pi)$ giving rise to waveforms 6a and 6b, the top edges of which sample the selected points of the resonances 1′, and 1 respectively.

A multiplexer 38 at the output of the receiver synchronously addresses the output signal on two output channels under the control of the programmer 39 so that during the interval $\tau_a$, corresponding to modulation with waveform 6a, the output signal appears at channel 38a while during the interval $\tau_b$, the signal appears at channel 38b. Normalized resonance levels are obtained by ratio detector 37 which obtains the ratio of output levels of channels 38a and 38b, which will result independent of the spectrometer controls settings and fluctuations. In this scheme, if the amplitude of wave 6a, is maintained constant, a slow linear scan of the amplitude of wave 6b will give an output level describing the profile of resonance 1 normalized with respect to the intensity of the point 2a of resonance 1′. Still further forms of the present invention derived from the multiplexed scheme of FIG. 2C are the ones wherein the commutation of the modulation amplitudes of waveforms 6a and 6b (represented by the dashed line between programmer 39 and field supply 22) is either substituted for, or integrated by a commuting of the DC field $H_o$ among a succession of indifferent intensities $H_o$, $H_{o1}, \ldots H_{om}$ during time lengths $T_1, T_2, \ldots T_m$. For example, when the DC field is commuted, for the time intervals $\tau_a$ and $\tau_b$, the final result of any combination of square wave modulation amplitude and commuting DC field is such that during any interval $\tau_a$ and $\tau_b$, two different points of the resonance spectrum are sampled by either top or bottom edges of the modulation waves. Further, for obtaining a resonance scan, either the amplitude of the square modulation wave or the DC field value relative to a given interval, or both, may be slowly linearly changed.

All the possible forms of the present invention, like those illustrated in FIG. 2A and FIG. 2C and those derived from them, when working with a single frequency of modulation, will thereinafter be called "slow, large, square wave monochannel multiplexed schemes", and will be intended working in general by monitoring a plurality of resonance points of the spectrum, each normalized with respect to a different monitored resonance intensity taken as reference.

It is also to be intended that many forms of the present invention may be derived also from the slow, large, square wave multichannel scheme illustrated in a particular form in FIG. 2B, including DC field intensity commutation together with square wave amplitude commutation by programmed sequences of time intervals, $\tau_1$, $\tau_2$ . . . as described above for the monochannel multiplexed scheme, giving rise to derived schemes which we shall refer to as "slow, large square wave multiplexed multichannel scheme".

Still further, we observe that in the scheme of FIG. 2C, a square wave asymmetric modulation scheme is described; however a symmetric modulation scheme like that used in the multiplexed scheme illustrated in FIG. 2B, could be employed with similar results and viceversa.

In extending such a feasibility to the cases in which more of one modulation frequency is employed, it is easily seen that also multichannel multiplexed schemes may employ both symmetric and asymmetric modulation schemes and still representing forms of the present invention.

In using any one of the forms of the present invention as illustrated above or any one form derived from them, it might occur that in the resonance spectrum of the sample to be examined a background resonance is present and it might not be possible to use DC field commuting intensities and square waves of such amplitudes that the corresponding resultant field intensity bottom (or top) ends would fall of said background resonance. Thus a "bias" intensity respresented by the detected background resonance signal would increase the reading of the resonance intensity monitored by the top (or bottom) ends of the modulation waves intensity in that it is actually added to it, impairing the measure of correct resonance intensities. In order to improve the performance of the spectrometer in some of the cases illustrated above, a constant electronic zero setting might be introduced.

As examples of practical applications of the slow, large, monochannel square wave modulation scheme, we reproduce in FIG. 3A, FIG. 3B, FIG. 3C, FIG. 3D and FIG. 3E some experimental waveforms obtained by employing one of such schemes in an electronic paramagnetic resonance homodyne spectrometer working in the X-band of microwaves and with a DC field of about 3,500 gauss of intensity. The sample employed was Tanane radical dissolved in dioxane, the absorption spectrum of which was a narrow line triplet exhibiting an hyperfine constant of about 17 gauss. The recorded spectra of FIG. 3A, FIG. 3B and FIG. 3C correspond to a modulation frequency of 14 Hz, that is a slow modulation ($\omega_m << 1/T_2$), being the linewidth of about 4.5 gauss. The modulation amplitude decreases going from FIG. 3A, to FIG. 3B and to FIG. 3C from 40 gauss to 1 gauss in the latter case. The signal processing was carried out by a phase sensitive detector having a reference signal at the modulation frequency $\omega_m$. It is easily seen that the waveform of FIG. 3A is closely related to waveforms 4' and 4" of FIG. 2A, whilst, for modulation amplitudes comparable (FIG. 3B) and smaller (FIG. 3C) than the resonances linewidth, one obtains first derivative-like lineshapes.

The FIG. 3D and FIG. 3E represent two spectra of the same sample obtained by the same spectrometer simultaneously, by dual channel detector each provided by a phase sensitive detector working at one of the two modulation frequencies employed. Thus for the waveform of FIG. 3E a derivative sinusoidal modulation scheme has been employed ($\omega_m/2\pi = 1000$ Hz; modulation amplitude; 1 gauss) whilst the waveform 3D has been obtained by a simultaneous slow square wave modulation of large amplitude (14 Hz; 135 gauss). It may be noted in the latter case that, besides obtaining the true absorption waveform, an increase in the signal-to-noise ratio has been obtained which can be directly evaluated having employed receivers with the same bandwidth.

All the forms described for the present invention and all those which can be derived from them maintaining the same working principles may be made working as well with modulation waves of the DC field which would employ waveforms also differing from the square one illustrated above however maintaining the imposed conditions to their frequency for being "slow" and in any case performing a switching action between two stationary resultant field intensity values.

Further, for any waveform used, any suitable detection scheme, which may be different from those illustrated in the present specification, may be employed to obtain original and useful results. Still further, slow trapezoidal modulation waves, either symmetrical or possessing rising and falling fronts of any shape however symmetrical or antisymmetrical but periodical, as required by the present invention, would generate, by the disclosed mechanisms described in the present invention, resonance signals modulated with the same periodicity, the amplitude of which would in any case result proportional to the difference of the resonance intensities switched by the extreme stationary values of the modulated field. The detection of said periodically modulated resonance signals may be made by anyone skilled in the art of signal processing with synchronous means which might exclude possible contributions due to the passages through the resonance during the rising and falling fronts. Further, it is also easy to show that by exploiting the criteria and schemes of modulation adopted in the present invention and others derived from these, one can obtain the same results using rectangular pulses with a duty cycle different from fifty percent, instead of square waves signals. In this case, it may be shown that the only difference is that the signal-to-noise ratio is lower than in the case where wave signals are used.

It is to be understood that the cited examples of particular embodiments of the present invention have been given by way of illustration and are not intended as limitation on the scope of the invention which is susceptible of many apparently widely different embodiments without departing from the scope thereof.

What we claim is:

1. A gyromagnetic resonance spectrometer for analyzing a sample containing gyromagnetic species, comprising: means for generating a vectorial uniform DC polarizing magnetic field of an intensity $H_o$ which is sufficient to cause said gyromagnetic species to resonate; a probe for supporting the sample within said DC field and including a magnetic assembly with a magnetic structure having associated input and output circuit means, coupled to RF transmitting means and RF receiving means, respectively, and said sample being located adjacent to said magnetic assembly, said transmitting means generating a signal at a frequency $\omega_o$ for exciting said sample through said magnetic assembly, with an RF magnetic field orthogonal to said DC field and of a power level set by said RF transmitter means, thereby generating a resonance signal which is coupled to said receiving means; magnetic field modulating means including coil means having windings with their axes dipsosed in predetermined orientation with respect to said DC field, and signal generating means connected to said windings for supplying to said windings a drive current which is at a frequency $\omega_o$ and which is switched between first and second intensity values thereby producing a square wave modulating magentic field which adds vectorially to said DC field, resulting in a square wave modulated vectorial magnetic field which is distributed over the sample volume, the extreme field intensity values of said modulated field on each of said species within said sample remaining substantially constant for a time corresponding to approximately the length of each half-period of said modulation frequency, one of said extreme intensity values of the field intensity corresponding to the peak value and the other to the valley value of said modulated field, said modulated field providing square wave periodical modulation of the intensity of the resonance curve of each gyromagnetic species within said sample, said frequency $\omega_m$ being substantially less than both the said frequency $\omega_o$ and the width of the resonance curve of said sample, said modulation of the resonance intensity reulsting in a switching of said resonance intensity between first and second different levels corresponding to the extreme distributions of said modulated field on said species with said sample, whereby the resultant resonance signal is constituted by a frequency modulation spectrum centered around $\omega_o$ and having sideband components separated by frequency $\omega_m$, and having amplitudes proportional to the difference between said first and second resonance intensity levels; said receiving means comprising detecting means for detecting one or more signal components of said modulation spectrum of said resultant resonance signal, and signal processing means for processing the detecting signal components and providing an output indicative of the difference between said first and second resonance intensity levels.

2. A gyromagnetic resonance spectrometer system accordng to claim 1 wherein said signal generating means of said modulating means generates a plurality n of square wave currents of different frequencies $\omega_1$, $\omega_2$, $\omega_n$, where n is any integer, said n currents being applied to said coil means to generate n slow modulation field distributions on the sample volumn at said frequencies $\omega_1$, $\omega_2$, ... $\omega_n$, each adding vectorially to said DC field, producing a resultant vectroial field distribution modulated by a complex waveform which produces on the sample resonance, an effect equivalent to that produced by superposition of effects generated by independent slow square modulation waves at each respective frequency, each of said n fields generating at its respecitve frequency a corresponding switching of the resonance intensity, whereby said n slow modulation fields give rise to a complex FM modulation spectrum comprised of an envelope of n superimposed spectra related to the slow modulations at said n frequencies $\omega_1$, $\omega_2$, ... $\omega_n$, the level of each component of each modulation spectrum being proportional to the difference between the resonance intensities switched by the respective square wave modulation at the respective frequency, said receiving means providing at least n channels and being operable to separate at least one component of each said modulation spectrum of said frequencies $\omega_1$, $\omega_2$, ..., $\omega_n$, the respective signal output levels of which being proportional to the difference between the two said resonance intensities switched by the respective square wave of said modulation field at the respective frequency.

3. A gyromagnetic resonance spectrometer system according to claim 1 wherein said DC field generating means includes programmer means operable to periodically commute during a given period T, the intensity $H_o$ of said DC field among a succession of m different intensities $H_o$, $H_{o1}$, ... $H_{om}$, where m is any integer, each maintained for given time intervals $t_1$, $t_2$, ... $t_m$ respectively, of durations which are always greater than the period of said square wave modulation frequency $\omega_m$, the commutation period being $T = t_1 + t_2 + ... + t_m$, said commuted intensities of $H_o$ being selected together with intensities of said square wave modulating field so that both said extreme values of said modulated resultant vectorial field on the sample are also commuted periodically in succession for the said m time lengths on generally different values, said commutation of said extreme values giving rise to processed components of said modulation spectrum also commuted among these relative to differences between the resonance intensity levels switched by the corresponding extreme values of said resultant field, said signal processing means including multiplexing means whereby its output is commuted synchronously on m distinct outputs during said time intervals $t_1$, $t_2$, ... $t_m$, and an output signal level is present on corresponding ones of said m outputs for the time length of the respective commutation time, which is proportional to the difference between the two said intensity levels of the resonance intensity as switched by said corresponding extreme values of said resultant field.

4. A gyromagnetic resonance spectrometer system according to either claim 2 or 3 wherein said signal processing means include ratio detecting means for obtaining the ratio between any two levels of said output signals, said ratio detecting means having output signals proportional to the ratio of all but one of said output levels corresponding to given differences between the intensities of given points of said resonance curve with a fixed difference between two particular intensities of said resonance curve taken as reference, whereby normalized output signals are obtained.

5. A gyromagnetic resonance spectrometer for analyzing a sample system containing gyromagnetic species, comprising: means for generating a vectorial uniform DC polarizing magnetic field of an intensity $H_o$ which is sufficient to cause said gyromagnetic species to resonate; a probe for supporting the sample within said DC field and including a magnetic assembly with a magnetic structure having associated input and output circuit means coupled to RF transmitting means and RF receiving means, respectively sample being located adjacent to said magnetic assembly, said transmitting means generating a signal at a frequency $\omega_o$ for exciting said sample, through said magnetic structure, with an RF magnetic field at an angle to said DC field and of a power level set by said RF transmitter means, thereby generating a resonance signal which is coupled to said receiving means; magnetic field modulating means including coil means having windings with their axes disposed in predetermined orientation with respect to said DC field, and signal generating means connected to said windings for supplying to said windings a drive current at a frequency $\omega_m$ and switched between first and second stationary intensity values thereby generating a modulating magnetic field which adds vectorially to said DC field, producing a modulated vectorial magnetic field which is distributed over the sample volume, the extreme field intensity values of said modulated field on each of said species within said sample remaining substantially constant for a time corresponding to at least half of each half-period of said modulation frequency, said modulated field providing periodical modulation of the intensity of the resonance curve of each gyromagnetic species within said sample, said frequency $\omega_m$ being substantially less than both said frequency $\omega_o$ and the width of the resonance curve of said sample, said modulation of the resonance intensity resulting in a switching of said resonance intensity between first and second different levels corresponding to the extreme distributions of said modulated field on said species within said sample, whereby the resultant resonance signal is constituted by a frequency modulation spectrum centered around $\omega_o$ and having sideband components separated by frequency $\omega_m$, with amplitudes proportional to the difference between said first and second resonance intensity levels, said receiving means having detecting means for detecting one or more signal components of said modulation spectrum, and signal processing means for processing the detected signal components and providing an output indicative of the difference between said first and second resonance intensity levels.

6. A gyromagnetic resonance spectrometer system according to claim 5 wherein said modulating means generates a uniform vectorial magnetic field the intensity of which is square wave modulated, the direction of said modulated uniform field coinciding with the direction of the representative vector of said DC field, the field intensity $H_o$ being selected such that one of said extreme resultant field intensity values corresponds to an off-resonance value of the polarizing field and said second resultant field intensity value corresponds to resonance value of the polarizing field, the levels of the output signals provided by said signal processing means giving quantitative information on the absolute value of said switched intensity level of said resonance curve sampled by said extreme resultant field intensity.

7. A gyromagnetic resonance spectrometer system according to claim 5 wherein said modulating means provides a rectangular wave current at the frequency $\omega_m$ switched between two stationary levels and having a duty cycle adjustable from between fifty percent and approximately one hundred percent.

8. A gyromagnetic resonance spectrometer system according to claims 2 or 5 wherein said modulating means provides asymmetrical square wave current intensities, giving rise to asymmetrical modulation of the DC field.

9. A gyromagnetic resonance spectrometer system according to claims 2 or 5 wherein said modulating means provides symmetrical square wave current intensities giving rise to symmetrical modulation of the DC field.

10. A gyromagnetic resonance spectrometer system according to claims 2 or 5 wherein the detection of the resonance signal is made synchronously during the time periods in which said extreme values remain stationary.

11. A method of analyzing a sample containing gyromagnetic species comprising: generating a uniform DC polarizing magnetic field having an intensity $H_o$ sufficient to cause said gyromagnetic species to resonate; placing said sample in a probe with said sample located in the proximity of a magnetic structure of the probe; coupling to said magnetic structure of the probe; coupling to said magnetic structure an RF signal at a frequency $\omega_o$, generated by suitable means, thereby generating an RF magnetic field at frequency $\omega_o$, orthogonal to said DC field, for exciting said sample, sensing the resulting resonance signal of said sample by receiving means coupled to said magnetic structure; generating a square-wave modulating vectorial magnetic field using a coil system having its axes oriented with respect to said DC field and supplied by a current at frequency $\omega_m$ and switched between first and second intensity values to generate on the sample a square-wave magnetic field which adds vectorially to said DC field, providing a vectorial magnetic field, distributed over the sample volume, which is modulated by square-wave intensities and has first and second level intensity values which remain substantially constant on each species within said sample for the duration of each half-period of said modulation frequency, one of said first and second intensity values of the resulting field intensity corresponding to the peak and the other to the valley of the resultant modulated field, said resultant modulated field causing periodical square-wave modulation of the intensity of the resonance curve of each gyromagnetic species within said sample, said frequency $\omega_m$ being substantially less than both frequency $\omega_o$ and the width of the frequency resonance curve of said sample thereby satisfying the requirements for a slow modulation of said resonance which results in a switching of said resonance intensity between two different levels corresponding to said peak and said valley of said resultant field on said species within said sample and giving rise to a corresponding complex RF resonance signal comprising a modulation spectrum composed of harmonic sideband components centered around $\omega_o$ and separated by frequency $\omega_m$, and each of said sideband components having an amplitude proportional to the difference between said first and second resonance intensity levels produced by said peak and valley intensity of said square wave modulated resultant field; and detecting at least one sideband harmonic component of said resonance signal to obtain quantitative information on said difference of the two said resonance intensity levels produced by said peak and valley intensity of said square-wave modulated resultant field.

12. A method of analyzing a sample containing gyromagnetic species comprising: generating a uniform DC polarizing magnetic field having an intensity $H_o$ sufficient to cause said gyromagnetic species to resonate; placing said sample in a probe with said sample located in the proximity of a magnetic structure of the probe; coupling to said magnetic structure an RF signal at a frequency $\omega_o$, generated by suitable means, thereby generating an RF magnetic field at frequency $\omega_o$ at an angle to said DC field, for exciting said sample; sensing the resulting resonance signal of said sample by a receiving means coupled to said magnetic structure; generating a vectorial magnetic field at a frequency $\omega_m$ by way of a modulating means for modulating said DC field providing a vectorial magnetic field distributed over the sample volume which is switched between first and second intensity levels which remain substantially constant on each species within said sample for the duration of at least one half of each half-period of said modulation frequency, one of said first and second intensity values of the resulting field intensity corresponding to the peak and the other to the valley of the resultant modulated field, said resultant modulated field causing a periodic modulation of the intensity of the resonance curve of each gyromagnetic species within said sample, said frequency $\omega_m$ being substantially less than both frequency $\omega_o$ and the width of the frequency resonance curve of said sample which results in a switching of said resonance intensity between two different levels corresponding to said peak and said valley of said resultant field on said species within said sample, giving rise to a corresponding complex RF resonance signal comprising a modulation spectrum composed of harmonic sideband components centered around $\omega_o$ and separated by frequency $\omega_m$, with each of said sideband components having an amplitude proportional to the difference between said first and second resonance intensity levels produced by said peak and valley intensity of said square wave modulated resultant field, and detecting at least one sideband harmonic component of said resonance signal by way of said RF receiving means to obtain quantitative information on said difference between said two said resonance intensity levels produced by said peak and valley intensity of said modulated resultant field.

13. A method according to claim 12 which further comprises deriving from said modulating means a synchronizing signal at frequency $\omega_m$ for application to said receiving means for synchronizing the operation of said receiving means with that of said modulation means.

14. A method according to claim 12 which further comprises periodically commuting said DC field during predetermined time intervals by way of a programmer means and multiplexing the output of the receiving means on a plurality of outputs by way of a multiplexing means controlled by said programmer means.

15. A method according to claim 12 which further comprises taking the ratio of at least one pair of signal outputs of said receiving means by way of a ratio detecting means to provide a normalized output signal representative of the difference between said two resonance intensity levels.

* * * * *